US008736361B2

(12) United States Patent
Nestler et al.

(10) Patent No.: US 8,736,361 B2
(45) Date of Patent: May 27, 2014

(54) HIGH-PASS COUPLING CIRCUIT

(71) Applicants: Eric Nestler, Concord, MA (US); Gustavo Castro, North Andover, MA (US)

(72) Inventors: Eric Nestler, Concord, MA (US); Gustavo Castro, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/693,590

(22) Filed: Dec. 4, 2012

(65) Prior Publication Data

US 2013/0120058 A1    May 16, 2013

Related U.S. Application Data

(63) Continuation-in-part of application No. 13/490,110, filed on Jun. 6, 2012, which is a continuation-in-part of application No. PCT/US2011/048278, filed on Aug. 18, 2011.

(60) Provisional application No. 61/493,893, filed on Jun. 6, 2011.

(51) Int. Cl.
*H03K 5/00* (2006.01)

(52) U.S. Cl.
USPC .......................................... 327/554; 327/559

(58) Field of Classification Search
USPC ................................................ 327/551–559
See application file for complete search history.

(56) References Cited

U.S. PATENT DOCUMENTS

| 4,077,035 A | | 2/1978 | Yee |
| 4,399,426 A | | 8/1983 | Tan |
| 4,551,686 A | * | 11/1985 | Benzinger ..................... 330/100 |
| 5,235,335 A | | 8/1993 | Hester |
| 5,369,407 A | | 11/1994 | Yung et al. |
| 5,581,252 A | | 12/1996 | Thomas |
| 5,684,478 A | | 11/1997 | Panaoussis |

(Continued)

FOREIGN PATENT DOCUMENTS

| DE | 10 2006 015762 | 10/2007 |
| EP | 0933870 | 8/1999 |

(Continued)

OTHER PUBLICATIONS

D'Mello, Design Approaches to Field-Programmable Analog Integrated Circuits, Analog Integrated Circuits and Signal Processing, 1998.

(Continued)

*Primary Examiner* — Dinh T. Le
(74) *Attorney, Agent, or Firm* — Occhiuti & Rohlicek LLP

(57) ABSTRACT

A filter provides high-pass coupling between circuits. The filter includes charge storage elements and switch elements coupling the charge storage elements. A controller is coupled to the switch elements for sequencing configurations of the switch elements in phases for each of a succession of sample periods to perform a time sampled continuous value signal processing of the input signal to form the processed signal. The sequenced configurations include a configuration in which a charge representing a value of the input signal is stored on a multiple of the charge storage elements, a configuration in which charge storage elements are coupled with the switch elements, and a set of one or more configurations that implement a scaling of a charge on one of the charge storage elements to be on one or more of the charge storage elements.

26 Claims, 4 Drawing Sheets

(56) References Cited

U.S. PATENT DOCUMENTS

| | | | |
|---|---|---|---|
| 6,054,945 | A | 4/2000 | Doyle |
| 6,414,541 | B1 | 7/2002 | Arvidsson |
| 6,859,762 | B2 | 2/2005 | Mawet et al. |
| 7,199,740 | B1 | 4/2007 | Ferguson, Jr. |
| 7,405,681 | B2 | 7/2008 | Jonsson et al. |
| 7,539,721 | B2 | 5/2009 | Belveze et al. |
| 7,791,407 | B2 | 9/2010 | Muhammad et al. |
| 7,804,434 | B2 | 9/2010 | Stoutjesdijk |
| 7,903,018 | B2 | 3/2011 | Schatzberger et al. |
| 7,965,135 | B2 | 6/2011 | Yoshizawa et al. |
| 8,067,972 | B2 | 11/2011 | Iida et al. |
| 2003/0018452 | A1 | 1/2003 | Mawet |
| 2003/0050027 | A1 | 3/2003 | Muhammad |
| 2005/0104654 | A1 | 5/2005 | Muhammad et al. |
| 2006/0071707 | A1 | 4/2006 | Belveze et al. |
| 2006/0269312 | A1 | 11/2006 | Muraishi |
| 2008/0048781 | A1 | 2/2008 | Wagner |
| 2008/0057900 | A1* | 3/2008 | Fang et al. .............. 455/296 |
| 2008/0129573 | A1 | 6/2008 | Mueck et al. |
| 2009/0002066 | A1 | 1/2009 | Lee |
| 2009/0322580 | A1 | 12/2009 | Belveze et al. |
| 2010/0198898 | A1 | 8/2010 | Pan |
| 2010/0223225 | A1 | 9/2010 | Vigoda et al. |
| 2010/0225419 | A1 | 9/2010 | Pan |

FOREIGN PATENT DOCUMENTS

| | | |
|---|---|---|
| EP | 1 018 806 | 7/2000 |
| EP | 2066028 | 6/2009 |
| WO | WO 00/77929 | 12/2000 |
| WO | WO2012/024507 | 2/2012 |

OTHER PUBLICATIONS

Martinez, Discrete Time Filters, Wiley Encyclopedia of Electrical and Electronics Engineering Dec. 1999.

Rivet, A 65nm CMOS RF Front End Dedicated to Software Radio in Mobile Terminals, Proc. SDR 2008.

Lacy, Cameron B., "Design of a Programmable Switched-Capacitor Analog FIR Filer," [online: retrieved Nov. 14, 2012 https://tspace.library.utoronto.ca/bitstream/1807/14967/1/MQ46200.pdf] XP55044242 (1999).

Maxim Integrated Products, "Do Passive Components Degrade Audio Quality in your portable device?" Jun. 16, 2004, 7 pages [retrieved online: http://www.maxim-ic.com/an317].

Maxim Integrated Products, "Capacitor Type Selection Optimizes PC Sound Quality for Windows Vista Audio Requirements," Nov. 6, 2008, 10 pages, [retrieved online: www.maxim-ic.com/an4333].

Mixed Signal Integration, "Selectable Highpass/Notch Filter" Data Sheet from Mixed Signal Integration Corporation, website: www.mix-sig.com, 6 pages, Jun. 2002.

*International Search Report*, PCT Application No. PCT/US2013/073011, mailed Mar. 14, 2014 (5 pages).

* cited by examiner

HIGH-PASS COUPLING CIRCUIT

CROSS-REFERENCE TO RELATED APPLICATIONS

This application is a continuation-in-part of U.S. patent application Ser. No. 13/490,110, titled "CHARGE SHARING TIME DOMAIN FILTER", filed on Jun. 6, 2012, which claims the benefit of U.S. Provisional Application No. 61/493,893 titled "CHARGE SHARING IIR FILTER" filed Jun. 6, 2011, and is a continuation-in-part of PCT Application No. PCT/US 11/48278, titled "CHARGE SHARING ANALOG COMPUTATION CIRCUITRY AND APPLICATIONS", filed on Aug. 18, 2011, and published as WO02012024507 on Feb. 23, 2012. The contents of each of the above-referenced applications is incorporated herein by reference.

BACKGROUND

This invention relates to coupling of circuits, and more particularly to high-pass coupling circuits.

The design process for a high-pass coupling circuit, also referred to as a DC (direct current, i.e., substantially constant or zero frequency) blocking circuit, can involve a number of conflicting goals or constraints when using capacitors combined with a resistance. These constraints include THD, noise, temperature, board area, cost, among others. Examples of DC blocking circuits 120, 124 are shown in FIGS. 1A and 1B for single-ended and differential signal, respectively. Note that the corner frequency (in Hertz) of the analog circuit 120 shown in FIG. 1A is $f_c=1/2\pi RC$. Therefore, as an example, with a corner frequency of $F_c=20$ Hz and a resistor value $R=1k\Omega$, the capacitor value would have to be $C=8\ \mu F$. Note that such a capacitor can be physically large, and costly to achieve high tolerance across a wide range of frequency and amplitude. For example, a 10% tolerance high-quality plastic film capacitor of such a capacitance may have physical dimensions of 15 mm by 16 mm, and cost more than $1.00 in lots of 1000.

There are at least some analog filtering parts sold as high-pass filters. The Mixed-Signal Integration (MSI) Corporation MSHN series is an example, which is implemented using clocked switched capacitor filter techniques. This series, and other products from MSI, only provide filtering of single-ended signal paths. The highpass corner frequency is generally determined as a fraction of the clocking frequency of the filter, for example, the MSHN6 has corner frequency that is 1/1000 of the clock frequency (e.g., a clock of 100 kHz would yield a corner frequency of 100 Hz). Although such a part could be used in place of the analog circuit of FIG. 1A, at least some performance and/or cost characteristics of such an approach may not be desirable. In addition, other clock to corner frequency ratio values are not available.

A high-pass coupling circuit may be useful to couple signal processing blocks in a signal chain to block DC offsets between blocks, which may result, for instance, for different voltage supply references being used in the different blocks.

SUMMARY

In one aspect, in general, a filter for coupling a first circuit to a second circuit includes an input for receiving an input signal from the first circuit and an output for providing processed signal to the second circuit. In some examples, the filter is for suppressing a low frequency band and passing a higher frequency band in a signal passing from the first circuit to the second circuit, for instance, using infinite-impulse-response (IIR) filtering. The filter has a plurality of charge storage elements and a plurality of switch elements coupling the charge storage elements. A controller is coupled to the switch elements for sequencing configurations of the switch elements in each of a plurality of phases of each of a succession of sample periods to perform a time sampled continuous value signal processing of the input signal to form the processed signal. The sequenced configurations include at least (a) a configuration in which a charge representing a value of the input signal is stored on a plurality of the charge storage elements, (b) a configuration in which a plurality of the charge storage elements are coupled with the switch elements to share charge among the coupled elements, and (c) a set of one or more configurations that implement a scaling of a charge on one of the charge storage elements to be on one or more of the charge storage elements.

The filter can have one or more of the following features.

The controller is configured to implement a high-pass filter. In some examples, the high-pass filter has a corner frequency lower corresponding to greater than 1,000 times the sample period. In some examples, the high-pass filter has a corner frequency lower corresponding to greater than 2,000, 4,000, or 10,000 times the sample period.

The controller is configured to implement a time-varying filter in response to detection of a trigger condition. In some examples, the controller is configured to progressively reduce a corner frequency of the high-pass filter after detection of the trigger condition (e.g., after increasing the corner frequency in response to the trigger condition). The controller may be configured to detect the trigger condition according to at least one of (a) a trigger control signal applied to the filter, (b) powering up of the filter, and (c) an internal detection of a transient condition in the input signal.

The time sampled continuous value signal processing of the input signal has a transform representation as a polynomial with at least one pole and one zero.

A magnitude of the scaling of the charge corresponds to a pole location of the transform representation.

The filter has an input for determining characteristics of the signal processing. In some examples, these characteristics include a corner frequency of a high-pass filter.

The input signal can be a singled ended input signal, or the input can be a differential input signal. The processed signal can be a single ended signal or a differential processed signal. In some examples, the input is singled-ended and the output is differential, and in some examples, the input is differential and the output is single-ended.

The filter further includes a clock coupled to the controller determining timing of the phases and sampling periods. Alternatively (or in addition), the filter has an input for accepting a clock signal for determining timing of the phases and sampling periods. In some examples, the filter also includes an output for generating a synchronization signal for other circuits, or other outputs generated by the onboard controller or clock.

The filter includes a configuration memory (e.g., volatile or non-volatile memory) coupled to the controller for storing a representation of the sequence of configurations of the switches.

The filter includes an input for accepting data specifying the sequence of configurations of the switches.

At most one active signal gain element couples charge storage elements on the signal path from the input to the output.

The filter includes power terminals for accepting power for operation of the controller and switches of the filter.

The filter is embodied in a packaged integrated circuit having output terminals for accepting the signal from the first circuit and for passing the processed signal to the second circuit.

In another aspect, in general, a method is used in coupling a first circuit and a second circuit and suppressing a low frequency band and passing a higher frequency band in a signal from the first circuit to the second circuit. The method includes controlling sequential configuration of a plurality of switch elements coupling a plurality of charge storage elements in each of a plurality of phases of each of a succession of sample periods to perform a time sampled continuous value signal processing of a input signal from the first circuit to form a processed signal for passing to the second circuit. The sequenced configurations include at least (a) a configuration in which a charge representing a value of the input signal is stored on a plurality of the charge storage elements, (b) a configuration in which a plurality of the charge storage elements are coupled with the switch elements to share charge among the coupled elements, and (c) a set of one or more configurations that implement a scaling of a charge on one of the charge storage elements to be distributed on one or more of the charge storage elements. In some examples, the controller is configured to implement a high-pass filter. In some examples, the high-pass filter has a corner frequency lower corresponding to greater than 1,000 times the sample period.

A coupling circuit as described herein can simplify the design of an interconnection of processing blocks at equal or lower cost of existing alternatives for the same performance.

Other features and advantages of the invention are apparent from the following description, and from the claims.

DESCRIPTION

Figure 1A:
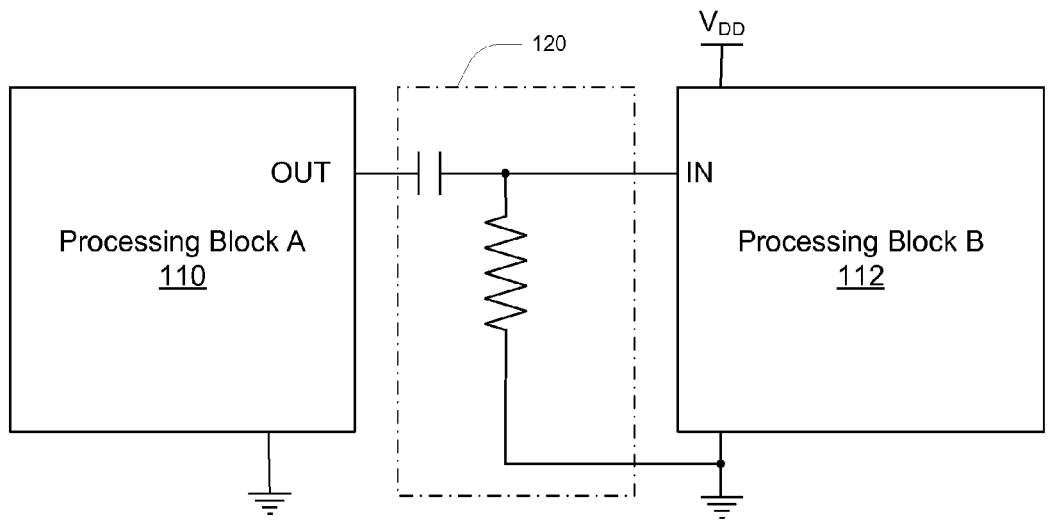
FIGS. 1A-B are circuit diagrams of single-ended and differential DC blocking circuits, respectively, linking signal processing blocks.
Figure 1B:
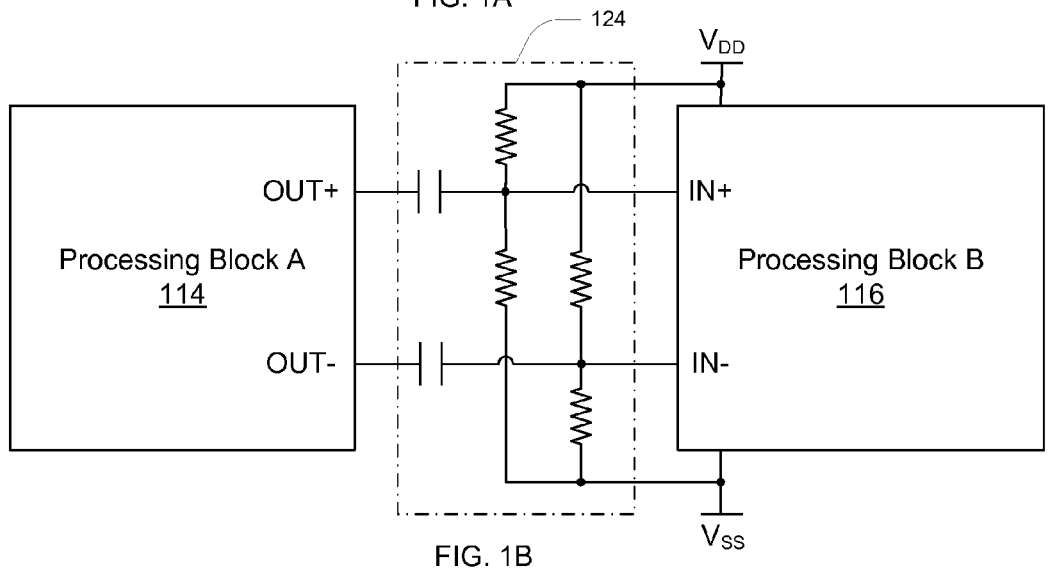
Figure 2:
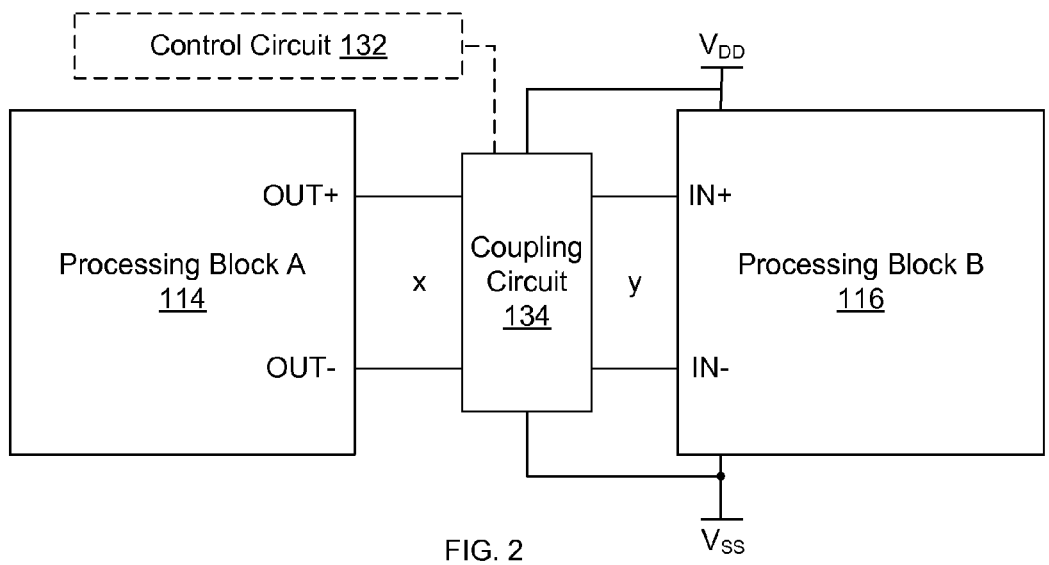
FIG. 2 is a circuit diagram of a coupling circuit linking signal processing blocks.

Referring to FIG. 2, an approach to coupling signal processing blocks 114 and 116 makes use of a coupling circuit 134. In at least some embodiments, the coupling circuit is implemented as an integrated circuit, for instance in a Dual-Inline Package (DIP), a Mini Small Outline Package (MSOP), or a Small Outline Integrated Circuit (SOIC) (e.g., Plastic Small-Outline Package (PSOP), Thin Small-Outline Package (TSOP), or Thin-Shrink Small-Outline Package (TSSOP)). The coupling circuit 134 illustrated in FIG. 2 has two inputs for accepting the differential output signals from processing block A 114, and has two outputs for providing differential balanced inputs to processing block B 116. The coupling circuit 134 receives the supply voltages used by processing block B 116. In some embodiments, the coupling circuit has one or more additional inputs (and optionally outputs as well) coupled to a control circuit 132 which control operation of the coupling circuit 134. The coupling circuit 134 can also be used with a single-ended input or a single-ended output, or both by appropriate connections of the input and output blocks 114 and 116. For instance, one output of the coupling circuit may be driven to $V_{DD}/2$ or another arbitrary reference level within the input range of block 116.

The coupling circuit internally implements a discrete time continuous value approach as introduced in U.S. patent application Ser. No. 13/490,110, titled "Charge Sharing Time Domain Filter", and the other related applications identified above, which are incorporated herein by reference. Different embodiments of the coupling circuit 134 implement different discrete time filters. For example, in some embodiments, a first order filter is implemented such that the transfer function is $$\frac{Y(z)}{X(z)} = \frac{b_0 + b_1 z^{-1}}{a_0 + a_1 z^{-1}}$$

which implements the Infinite Impulse Response (IIR) discrete time domain filter $$a_0 y[n] = b_0 x[n] + b_1 x[n-1] - a_1 y[n-1].$$

One choice of coefficients for the transfer function, which are used in an illustrative example, is $$\frac{Y(z)}{X(z)} = \frac{\alpha - \alpha z^{-1}}{1 - \alpha z^{-1}}$$

which implements the Infinite Impulse Response (IIR) discrete time domain filter $$y[n] = \alpha(x[n] - x[n-1] + y[n-1]),$$

which has a unity passband gain, or alternatively, $$\frac{Y(z)}{X(z)} = \frac{1 - z^{-1}}{1 - \alpha z^{-1}}$$

which implements the Infinite Impulse Response (IIR) discrete time domain filter $$y[n] = x[n] - x[n-1] + \alpha y[n-1],$$

which has a passband gain of $1/\alpha$.

Note that in this example, there is a zero at $z=1$ and a pole at $z=\alpha$. In order to achieve a corner frequency that is 1/6250 of the clock frequency (e.g., corner of 20 Hz with a clock frequency of 125 kHz), then approximately $a=1-20$ Hz/125 kHz or $\alpha=1-(1/6250)=0.9998$. Yet other coefficient sets may be determined using conventional filter design tools, for example, to achieve desired corner frequencies and attenuation levels below the corner frequency.

Figure 3:
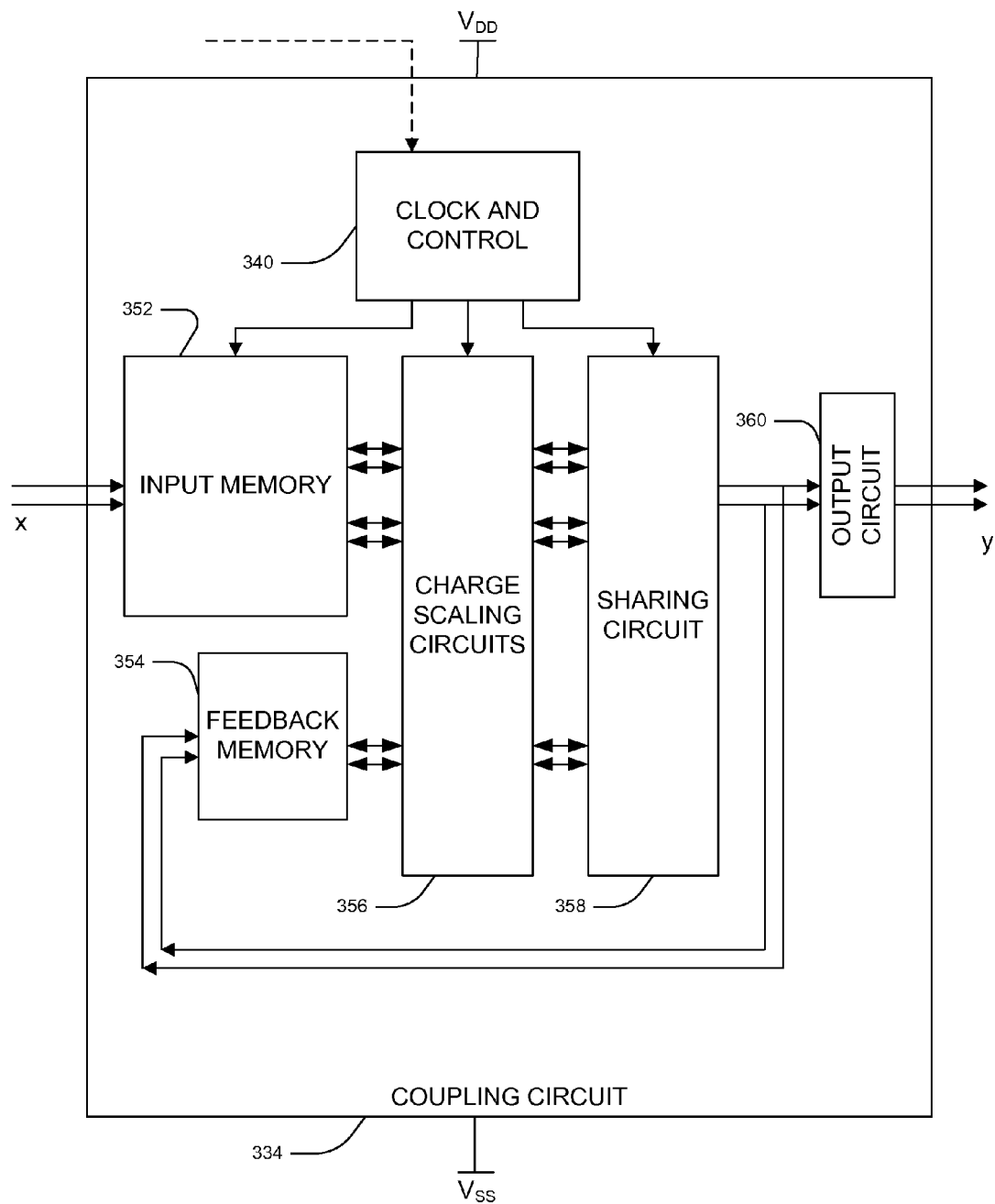
FIG. 3 is a block diagram of a coupling circuit.

Referring to FIG. 3, a coupling circuit 334 (an embodiment of the coupling circuit 134 shown in FIG. 2) is coupled to the voltage supply ($V_{DD}$ and $V_{SS}$) and includes internal clock and control circuitry 340, which include an oscillator, and control logic for controlling the various phases of configuration of the other modules. In some implementations, the clock and control circuitry is preconfigured, for example, with a fixed oscillator frequency. In other implementations, one or more control signals are provided to the circuit (illustrated as the broken signal path to the clock and control circuitry), for example to control clocking, filter characteristics, startup and transient control etc. The coupling circuit 334 includes an input memory 352, which holds samples of the input as charges on capacitive elements in the circuit, denoted as having capacitance $C_s$, and a feedback memory 354, which holds one or more past values of the output. Charge scaling circuits 356 includes circuitry for forming scaled (i.e., fractionally reduced) charges based on charges on elements of the input and feedback memory, and the sharing circuit 358 includes circuitry for summing the scaled charges to form the output, for example, to implement the IIR filter illustrated above. In some embodiments, an output circuit 360 maintains the output to be constant during each sample period or to implement an interpolation or lowpass or antialiasing filter based on the output of the sharing circuit.

Figure 4:
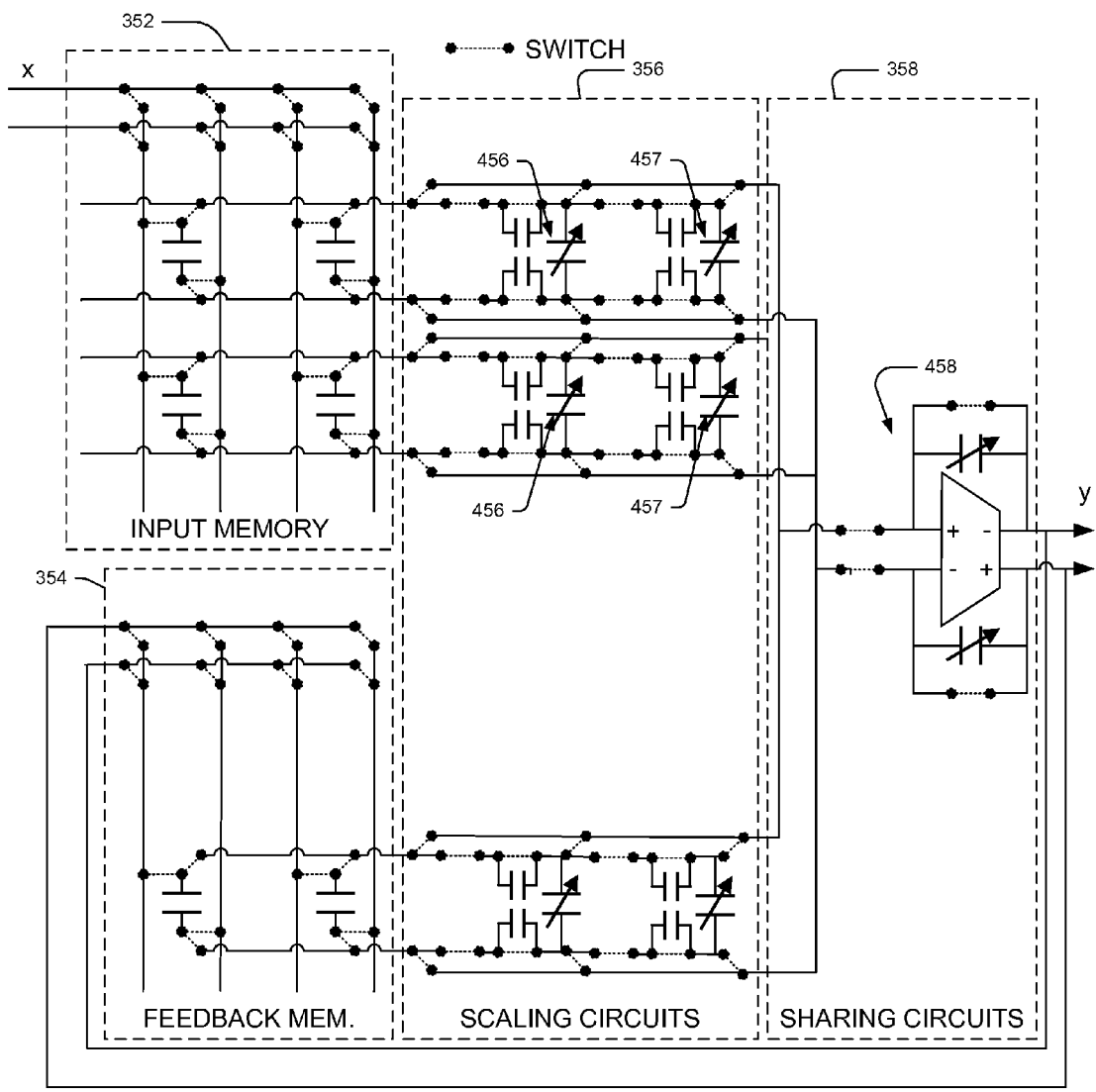
FIG. 4 is a circuit diagram of a coupling circuit.

FIG. 4 illustrates one specific approach to implementing the block diagram shown in FIG. 3, in the case of a IIR filter as illustrated above. Operation of this circuit can be understood as follows through a series of three phases for each sample period.

Phase 1: The differential inputs charge two of the capacitors of the input memory to a charge proportional to the differential input voltage x[n]. One of the two other capacitors has retained voltage of x[n−1] charged during phase 1 of the previous sampling period. Note also that one of the capacitors of the feedback memory has a voltage of y[n−1] from the previous sample period.

Phase 2: A capacitor of the input memory with charged to x[n] is coupled to a capacitor 456 of the scaling circuit, which has been discharged by switches not shown in the FIG. 4. The capacitor 456 is illustrated as a variable capacitor (e.g., implemented as a switchable bank or other interconnection of fixed capacitors with different configurations of the switches yielding different equivalent capacitances), which is under control of the clock and control circuit 340. However, in a fixed configuration, this capacitor may be fixed. With capacitor 456 having a capacitance of $C_a$, the voltage on the coupled capacitors is then x[n] $C_s/(C_s+C_a)$=x[n]/(1+$C_a/C_s$). For desired coefficient of 0.9998, a ratio of $C_a/C_s$=2×10$^{-4}$ yields a scaling of the voltage (and charge) on the memory capacitor by the desired coefficient. During this phase, an input memory capacitor holding a voltage of −x[n−1] is similarly scaled, as is a feedback memory capacitor holding a voltage of y[n−1].

Phase 3: The input and memory capacitors holding the scaled x[n], x[n−1] and y[n−1] voltages are coupled to the inputs of a differential operational amplifier 458, which transfers the sum of the charges to feedback capacitors (discharged in a previous phase) across the amplifier. The feedback capacitors are shown as variable capacitors (e.g., under the control of the clock and control circuit) but may be fixed, for example, to match (e.g., equal) the memory capacitors. The output of the differential amplifier, which is y[n] is used to charge one of the feedback memory capacitors for use in the next sample period.

Note that in some examples, the scaling of the charges is performed in two phases. For example, in a phase 2a, some of the charge is passed from an input capacitor with capacitance $C_s$ to a first capacitor 456 with capacitance $C_a$ of the scaling circuit. Then in a subsequent phase 2b, the first capacitor 456 is decoupled from the memory capacitor and coupled to a second capacitor 457 of the scaling circuit with capacitance $C_b$. In phase 3, both the memory capacitor with capacitance $C_s$ and the second scaling capacitor with capacitance $C_b$ are coupled together along with the capacitors for the other coefficients. A coefficient of 0.9998 can be achieved, for example, by choosing $C_a/C_s$=$C_a/C_b$=1.5×10$^{-2}$. Note this requires a ratio of capacitor sizes less than two orders of magnitude, rather than the four orders of magnitude in the single scaling phase example.

It should be understood that many other sequences of sharing stages may be used to achieve the desired coefficients. Note also that the transfer function implemented does not have to be first order. For example, a second order (e.g., a biquad) filter may be used, for example, as described in detail in copending U.S. patent application Ser. No. 13/490,110, titled "CHARGE SHARING TIME DOMAIN FILTER". It should also be understood that single-ended processing is also possible using the approach described above and in the co-pending applications. In some implementations, certain parts of the circuit shown in FIG. 4, can be omitted. For example, to implement a transfer function $$\frac{Y(z)}{X(z)} = \frac{1-z^{-1}}{1-\alpha z^{-1}}$$

scaling circuits for the input memory are not required because the coefficients are +1 and −1. For example, the operational amplifier in circuit 458 is operated as an integrator by not resetting the feedback capacitor around the amplifier between samples.

Various embodiments have different numbers of pins on the integrated circuit. Some examples include:
- 4 pins: power, ground, input, output. This example can include an on-chip clock generator and use a fixed corner frequency providing advantages include minimizing pin count for cost and board area benefits as well as others;
- 6 pins: 2 power, 2 differential inputs, 2 differential outputs. This example can also have on-chip clock generation and a fixed corner frequency differing from the 4-pin example by handling differential inputs and outputs;
- 8 pins: 2 power, 2 differential inputs, 2 differential outputs, 2 control/clock signals (see discussion below).
- 16 pins: 2 power, 2 differential inputs, 2 differential outputs, clock input, and one or more other inputs or outputs from but not limited to the following: SYNCO, a digital output for synchronizing to an ADC; CSB, a digital input and chip select for an SPI port and also an ADR1 output bit for the I$^2$C master; BOOTB, a digital input to enable reading the filter codes from an external I$^2$C EPROM chip; VOCM, an analog voltage to set the output common mode voltage of the sampled outputs voltage pins; XOUT, a 2$^{nd}$ pin used for a crystal oscillator such that the crystal is connected between CLKIN and XOUT pins; SDI, a digital pin and the serial output for the SPI port and also the ADR0 bit output for the I$^2$C port; SDO, a digital output for the SPI port and the digital I/O for the I$^2$C master port; and SCLK, a digital serial clock input for SPI and I$^2$C.

Control inputs can be used for various purposes. For example, a serial control signal can be used to configure the filter coefficients and/or a clock multiplier to achieve a desired runtime behavior. Such a configuration is stored in a volatile or non-volatile memory on the device. In some implementations, the configuration is performed at power-up of the device, while other implementations that use non-volatile memory are preconfigured, for example, during a manufacturing or testing procedure.

Control inputs can also be used to select between a differential and singled-ended operating mode, for example, causing one output to be driven to $V_{DD}/2$, or another reference level within the input range of block 116, in the single-ended mode.

It should be noted that transient behavior of a circuit with a very low corner frequency may be undesirable. For example, a step input may result in a saturation of the output for a time of the order of $1/F_c$, which can several seconds. Therefore, in some implementations, a time varying filter may be used in which a relatively higher corner frequency is initially used, for example, $F_c^0=1000$ Hz. Then the corner frequency is reduced in one, two, or multiple steps to reach the operating point, for example, of $F_c^1=20$ Hz. In some implementations, initiation of the progression from higher to lower corner frequency is based on one or more of (1) a trigger control signal applied to the circuit, (2) powering up of the circuit, and (3) internal detection of a step or other transient condition, for example, according to a saturation of the output.

Other configurations of charge sharing and transfer may also be used. For example, by retaining the charge on the feedback capacitors in the circuit 458 (see FIG. 4), circuit 458 functions as an integrator without leaking or dumping the charge on the capacitors between time samples. Furthermore, the feedback memory 354 and corresponding parts of the scaling circuits are omitted, thereby yielding a transfer function $$\frac{Y(z)}{X(z)} = \frac{b_0}{1-z^{-1}}.$$

Figure 5:
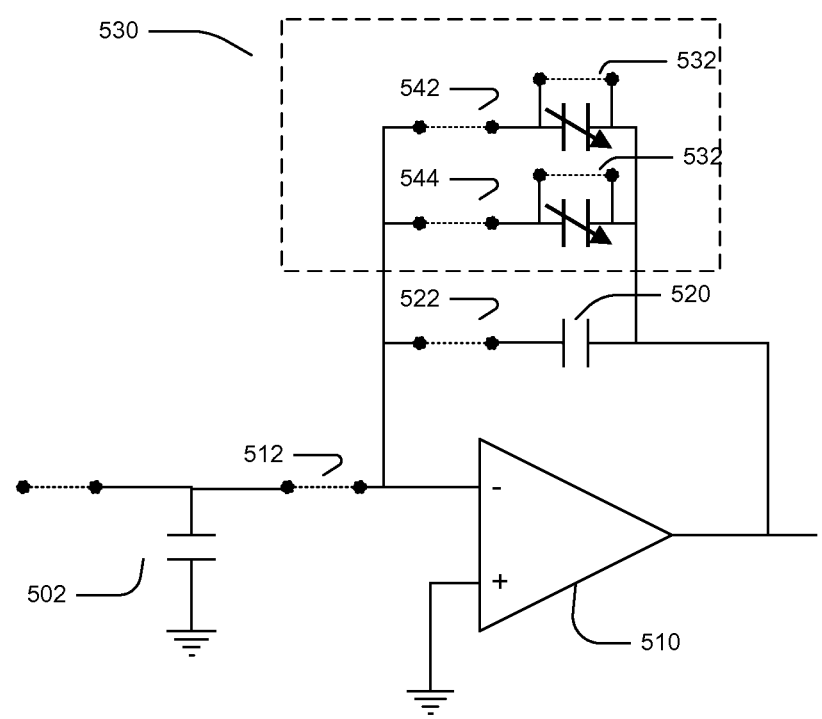
FIG. 5 is a integrator using a charge transfer and sharing approach.

As another example, it should be noted that a transfer function of $1/(1-\alpha z^{-1})$ may be implemented by using a leaky switch capacitor integration circuit as shown in FIG. 5. At each sample, the input is represented by the voltage on capacitor 502. Assume that initially capacitor 520 is discharged for example, by previously closing switches 522 and 532. In one example, operation at each time sample operates in a series of phases. Capacitor 502 is charged with voltage x[1]. In phase 1, switch 512 and 522 are closed, thereby transferring the sum of the charge on capacitor 502 to capacitor 520. In one or more further phases, a fraction of the charge on capacitor 522 is transferred to one or more of capacitors 542-544. For example, in a second phase switches 522 and 544 are closed, then to generate the desired output, switch 544 is opened [the new output is generated when switch 544 is closed. Opening switch 544 does not change the output and is only opened before next phase 1 when capacitor 502 is transferred to capacitor 520.]. For example, if capacitors 502 and 520 have capacitance $C_0$ and capacitor 544 has capacitance $C_a$, after the first phase, the output is −x[1], and after the second phase, the output is y[1]=−x[1]($C_0/(C_0+C_a)$). Now if capacitor 502 has been charged to x[2] before the next phase 1, then at phase 1 of the second time sample, the charge from capacitor 502 is transferred to capacitor 522, and the output is −x[2]−x[1]($C_0/(C_0+C_a)$), and after the second phase the output is y[2]=x[2]($C_0/(C_0+C_a)$)−x[1]($C_0/(C_0+C_a)$)$^2$.

The general approach shown in FIG. 5 can be applied to the circuit in FIG. 4 by partially rather than fully discharging the capacitors on the feedback paths of differential operational amplifier 458. In some implementations, such a "leaky" integration can replace the need for the feedback memory by essentially implementing the denominator of a first order transfer function for the coupling circuit. Note that a transfer function of $$\frac{Y(z)}{X(z)} = \frac{\alpha - \alpha z^{-1}}{1 - \alpha z^{-1}}$$

can be implemented without scaling the input memory values, and implementing a leaky integrator similar to that shown in FIG. 5 scaling the charge on the feedback capacitor by α on each time sample.

In configurable versions of a coupling circuit of the type described above, poles and zeros of the transfer function are generally very close to z=1. A consequence of this is that for a first order filter, the coefficients are all very close to 1.0. For higher order transfer functions, more generally, the coefficients are all very close to integer values. This observation permits design of a configurable filter such that the configuration of switches to share charge in one or multiple phases provides high accuracy near those close-to-integer coefficient values and relatively less accuracy elsewhere. Therefore, an n-bit configuration value of a coefficient can yield far higher coefficient accuracy than $2^{-n}$. Similarly, selection for available modes of sequential sharing of charge in the charge scaling circuits may be tailored to provide high accuracy at such near-integer coefficients. There are a number of ways of implementing this feature. In one way, as described with reference to FIG. 4, the circuit has numerator and denominator scaling circuits that form outputs that are summed and then amplified appropriately to make the output and this also drives the feedback memory for recursion. In another way, the gain stage analogous to circuit 458 is a switch capacitor integrator. If the numerator is a single coefficient, b0 and no $z^{-1}$ term, then the resulting transfer function is the same as in the first way above. The numerator can have more terms, effectively making a more complicated filter, such as a bandpass shape. In another way, the circuit analogous to circuit 458 is a leaky switch capacitor integrator to generate the $1/(1-z^{-1})$ term, and there is no need for recursion (i.e., old y values do not have to be summed with numerator outputs) and the numerator would be in the simplest form to get the high pass filter form x[n]−x[n−1], or $b_0$=+1 and $b_1$=−1 or a differentiator.

The discussion above describes a discrete time filter approach. As such, an assumption is made that the input is frequency limited to the Nyquist frequency (i.e., to no higher than one half the sampling frequency). In some implementations, the input is known to be frequency limited due to characteristics of the previous processing block. In some implementations, the coupling circuit has an internal lowpass filter to prevent undersampling. In one implementation, an active lowpass filter is inserted before the input memory. In other implementations, lowpass filtering is achieved in a passive manner, for example, by taking advantage of a natural time constant of charging of the input capacitors, for example, by input capacitors over multiple sampling periods using a multiplicity of sampling capacitors to permit such concurrent charging. In some implementations, the output is lowpass filtered to a fraction of the sampling frequency by using a bandpass filter (e.g., with corners at 1/10000 and 1/10 of the sampling frequency), thereby permitting filtering of the sampled-and-held output with a relatively simple anti-aliasing filter.

Although described above in the context of a discrete package, it should be understood that the coupling circuit may be incorporated into a large integrated circuit, for example, one in which there are multiple power domains.

It is to be understood that the foregoing description is intended to illustrate and not to limit the scope of the invention, which is defined by the scope of the appended claims. Other embodiments are within the scope of the following claims.

What is claimed is:

1. A filter for coupling a first circuit to a second circuit, the filter comprising:
    an input for receiving an input signal from the first circuit;
    an output for providing a processed signal to the second circuit;

a plurality of charge storage elements;
a plurality of switch elements coupling the charge storage elements; and
a controller coupled to the switch elements for sequencing configurations of the switch elements in each of a plurality of phases of each sample period of a succession of sample periods to perform a time sampled continuous value signal processing of the input signal to form the processed signal;
wherein the sequenced configurations include at least
a configuration in which a charge representing a value of the input signal is stored on each storage element of a first group of storage elements of the plurality of charge storage elements,
a configuration in which a second group of storage elements of the plurality of the charge storage elements are coupled with the switch elements to share charge among the coupled elements of the second group, and
a set of one or more configurations that implement a scaling of a charge on one of the charge storage elements to be distributed on one or more of the charge storage elements.

2. The filter of claim 1 configured to suppress a low frequency band and pass a higher frequency band in the input signal passing from the first circuit to the second circuit.

3. The filter of claim 1 wherein the time sampled continuous value signal processing of the input signal comprises an infinite impulse response filtering.

4. The filter of claim 1 wherein the controller is configured to implement a high-pass filter.

5. The filter of claim 4 wherein the high-pass filter has a corner frequency corresponding to greater than 1,000 times the sample period.

6. The filter of claim 5 wherein the high-pass filter has a corner frequency corresponding to greater than 4,000 times the sample period.

7. The filter of claim 4 wherein the controller is configured to implement a time-varying filter in response to detection by the controller of a trigger condition.

8. The filter of claim 7 wherein the controller is configured to progressively reduce a corner frequency of the high-pass filter after detection of the trigger condition.

9. The filter of claim 7 where the controller is configured to detect the trigger condition according to at least one of (a) a trigger control signal applied to the filter, (b) powering up of the filter, and (c) an internal detection of a transient condition in the input signal.

10. The filter of claim 1 wherein the time sampled continuous value signal processing of the input signal has a transform representation as a polynomial with at least one pole and one zero.

11. The filter of claim 10 wherein a magnitude of the scaling of the charge corresponds to a pole location of the transform representation.

12. The filter of claim 1 further comprising an input for receiving information for determining characteristics of the time sampled continuous value signal processing.

13. The filter of claim 12 wherein the characteristics of the signal processing include a corner frequency of a high-pass filter.

14. The filter of claim 1 wherein the input signal comprises a differential input signal.

15. The filter of claim 1 wherein the processed signal comprises a differential processed signal.

16. The filter of claim 1 further comprising a clock coupled to the controller determining timing of the phases and sampling periods.

17. The filter of claim 1 further comprising an input for accepting a clock signal for determining timing of the phases and sampling periods.

18. The filter of claim 1 further comprising a configuration memory coupled to the controller for storing a representation of the sequence of configurations of the switches.

19. The filter of claim 18 wherein the configuration memory comprises a non-volatile memory.

20. The filter of claim 1 further comprising an input for accepting data specifying the sequence of configurations of the switches.

21. The filter of claim 1 wherein there is at most one active signal gain element coupling charge storage elements on the signal path from the input to the output.

22. The filter of claim 1 further comprising power terminals for accepting power for operation of the controller and switches of the filter.

23. The filter of claim 1 wherein the filter is embodied in a packaged integrated circuit having output terminals for accepting the signal from the first circuit and for passing the processed signal to the second circuit.

24. A method for coupling a first circuit and a second circuit and suppressing a low frequency band and passing a higher frequency band in a signal from the first circuit to the second circuit, the method comprising:
controlling sequential configuration of a plurality of switch elements coupling a plurality of charge storage elements in each of a plurality of phases of each sample period of a succession of sample periods to perform a time sampled continuous value signal processing of a input signal from the first circuit to form a processed signal for passing to the second circuit;
wherein the sequenced configurations include at least a configuration in which a charge representing a value of the input signal is stored on each storage element of a first group of storage elements of the plurality of charge storage elements, a configuration in which a second group of storage elements of the plurality of the charge storage elements are coupled with the switch elements to share charge among the coupled elements of the second group, and a set of one or more configurations that implement a scaling of a charge on one of the charge storage elements to be distributed on one or more of the charge storage elements.

25. The method of claim 24 wherein the controlling of the sequential configurations includes high-pass filtering the signal from the first circuit.

26. The method of claim 25 wherein the high-pass filter has a corner frequency corresponding to greater than 1,000 times the sample period.

* * * * *